United States Patent
Jain et al.

(10) Patent No.: US 8,027,213 B2
(45) Date of Patent: Sep. 27, 2011

(54) MECHANISM FOR MEASURING READ CURRENT VARIABILITY OF SRAM CELLS

(75) Inventors: Ashish R. Jain, Santa Clara, CA (US); Priya Ananthanarayanan, Cupertino, CA (US); Greg M. Hess, Mountain View, CA (US); Edgardo F. Klass, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 225 days.

(21) Appl. No.: 12/488,121

(22) Filed: Jun. 19, 2009

(65) Prior Publication Data

US 2010/0322026 A1 Dec. 23, 2010

(51) Int. Cl.
*G11C 7/00* (2006.01)

(52) U.S. Cl. .......... 365/203; 365/154; 365/222

(58) Field of Classification Search ......... 365/203, 365/154, 222, 229, 226, 189.05, 156, 189.04, 365/201, 200, 230.08, 230.03, 189.08
See application file for complete search history.

(56) References Cited

U.S. PATENT DOCUMENTS

| | | | |
|---|---|---|---|
| 7,376,001 B2 | 5/2008 | Joshi et al. | |
| 7,409,305 B1 * | 8/2008 | Carpenter et al. | 702/75 |
| 7,620,510 B2 | 11/2009 | Carpenter et al. | |
| 7,760,565 B2 * | 7/2010 | Kuang et al. | 365/201 |
| 7,788,554 B2 * | 8/2010 | Adams et al. | 714/718 |
| 2004/0160839 A1 * | 8/2004 | Kim | 365/222 |
| 2006/0097802 A1 | 5/2006 | Chan et al. | |

* cited by examiner

*Primary Examiner* — Dang Nguyen
(74) *Attorney, Agent, or Firm* — Lawrence J. Merkel; Meyertons, Hood, Kivlin, Kowet & Goetzel, P.C.

(57) ABSTRACT

A mechanism for measuring the variability of the read current of SRAM cells on an integrated circuit includes the integrated circuit having an SRAM array including a plurality of SRAM cells. The integrated circuit may also include a selection circuit configured to select a particular SRAM cell in response to a selection input. An oscillator circuit such as a ring oscillator, for example, on the integrated circuit may be configured to oscillate at a frequency that is dependent upon a read current of a selected SRAM cell during operation in a first mode. A frequency determining circuit that is coupled to the oscillator circuit may be configured to output a value corresponding to the frequency of oscillation of the oscillator circuit.

17 Claims, 4 Drawing Sheets

_US 8,027,213 B2_

MECHANISM FOR MEASURING READ CURRENT VARIABILITY OF SRAM CELLS

BACKGROUND OF THE INVENTION

1. Field of the Invention

This invention relates to the field of integrated circuits and, more particularly, to test circuits and memory devices.

2. Description of the Related Art

Circuits such as static ram (SRAM) cells are widely used as computer memory to store bits of information. SRAM is used particularly in applications where access speed is required because SRAM cells provide relatively fast access times compared to their dynamic RAM counterparts. However, SRAM devices may be more expensive to manufacture. Thus, SRAM arrays are typically used in processor cache memory, while DRAM devices are typically used as computer system main memory due to such factors as cost. One issue with manufacturing the SRAM cells is depending on process parameters during manufacturing, it may be possible for the read current associated with each SRAM cell to vary from cell to cell and between manufacturing lots. This variability may present reliability problems, particularly when attempting to design associated sense amplifiers for the SRAM cells.

The manufacturing of integrated circuits is a complex process. Bringing a new circuit design to a fabrication facility, or bringing an existing circuit design to a new fabrication facility may require a number of characterization steps to establish a device library. Depending on the process technology, and the complexity of the circuits, there may be several iterations of process adjustments to ensure reliable operation of the manufactured devices. In many cases, there may be several revisions of silicon before the design is fully operational. Accordingly, it may be desirable to provide a robust circuit design while reducing the number of iterations of process adjustments, particularly during device and process characterization.

SUMMARY

Various embodiments of mechanism for measuring the variability of the read current of SRAM cells on an integrated circuit are disclosed. In one embodiment, the mechanism includes an integrated circuit having an SRAM array including a plurality of SRAM cells. The integrated circuit may also include a selection circuit coupled to the SRAM array and configured to select a particular SRAM cell of the plurality of SRAM cells in response to a selection input. An oscillator circuit such as a ring oscillator, for example, on the integrated circuit is coupled to the SRAM array and may be configured to receive a signal indicative of a read current of a selected SRAM cell and to oscillate at a frequency that is dependent upon the read current of the selected SRAM cell during operation in a first mode. A frequency determining circuit that is coupled to the oscillator circuit may be configured to output a value corresponding to the frequency of oscillation of the oscillator circuit. The frequency of oscillation may also be dependent on a precharge current applied to a bit line of the selected SRAM cell, but to lesser degree.

In another embodiment, a method for executing a read current variability test of an SRAM array within an integrated circuit may include writing a value to at least a portion of the SRAM cells in the SRAM array. The method may also include a selection circuit selecting a particular SRAM cell, and an oscillator circuit receiving a signal indicative of a read current of a selected SRAM cell and oscillating at a frequency that is dependent upon the read current of the selected SRAM cell during operation in a first mode. The method may further include a frequency determining circuit outputting a value corresponding to the frequency of oscillation of the oscillator circuit. In one implementation, the oscillations may be established by the oscillator circuit alternately enabling precharging and enabling the read current to flow from the selected SRAM cell.

Figure 1:
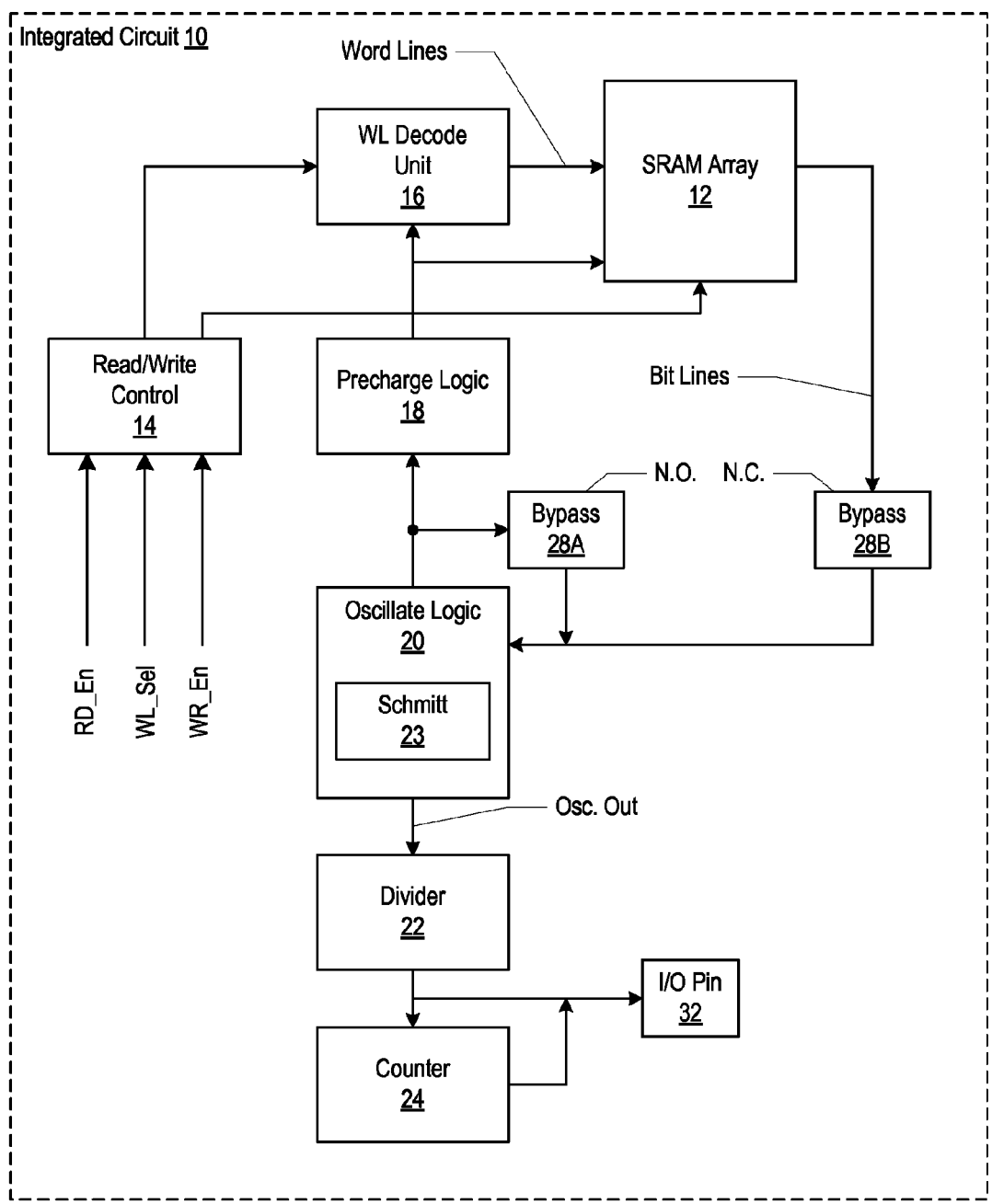
FIG. 1 is a block diagram of an integrated circuit including one embodiment of a mechanism for measuring SRAM read current variability.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION

Turning now to FIG. 1, a block diagram of one embodiment of an integrated circuit including an embodiment of an SRAM read current variability measurement mechanism is shown. The integrated circuit 10 includes an SRAM array 12 that is coupled to a write line (WL) decode unit 16, a read/write control unit 14 and a precharge logic unit 18. The integrate circuit 18 also includes an oscillate logic unit 20 which is coupled to a divider 22 and a pair of bypass gates designated 28A and 28B. Lastly the integrated circuit 10 includes a counter 24 that is coupled to an I/O pin 32 and to the divider 22.

In one embodiment, the SRAM array 12 may include a number of SRAM cells (shown in FIG. 2), each configured to store one bit of information. For example, in one implementation, the SRAM array 12 may include 512 SRAM cells. However, the SRAM array 12 may include any number of cells as desired. In addition, the SRAM array 12 may include bit lines and word lines which may be used to read and write data into each cell of the SRAM array 12. Accordingly, in one embodiment during read and write operations, read/write control 14 may generate control signals in response to receiving input signals read enable (RD_En), write enable (WR_En), and write select (WL_Sel) signals. In one embodiment, the input signals may be provided from another circuit on integrated circuit 10, or alternatively, the input signals may be provided by an external circuit or test system.

In one embodiment, the WL decode unit 16 may decode the WL_Sel lines received from the read/write control 14 and may generate one or more word line select signals to access each cell in the SRAM array 12 individually. For example, in one embodiment, the WL_Sel may be a 9-bit encoding to generate the appropriate word line signals to access from 0 to 511 cells of the SRAM array 12.

Figure 2:
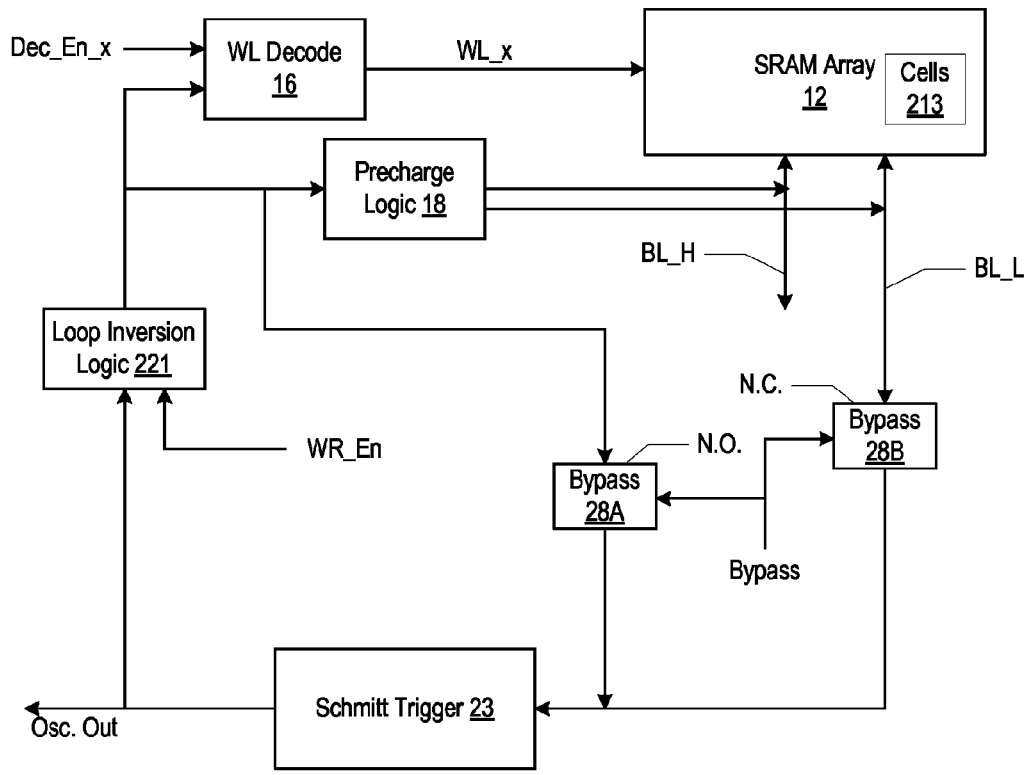
FIG. 2 is a diagram depicting more detailed aspects of a portion of the embodiment of the SRAM read current variability measurement mechanism of FIG. 1.

As shown, bit lines from the SRAM array 12 are coupled through bypass gate 28B to oscillate logic 20. As described in greater detail below, the Schmitt trigger 23 within the oscillate logic 20 may generate a rectangular wave at a frequency that corresponds to a triangular waveform input caused by the alternating precharging of the bit lines and decaying of the read current of each SRAM cell. As shown in FIG. 2, the rectangular wave output of the Schmitt trigger 23 is used to enable and disable the precharging of the bit lines. This feedback of the bit line (e.g., read and precharge) current and alternatingly turning on and off the precharge current generates the oscillation. Accordingly, the output of oscillate logic 20 is provided to enable precharge logic 18, which may precharge the bit lines in the SRAM array 12.

The output of oscillate logic 20 is also provided to bypass gate 28A, which is shown as a normally open connection. As described in greater detail below, during operation in a bypass mode, the output of the Schmitt trigger 23 may be fed back through the logic gates within oscillate logic 20, and through bypass gate 28A. Thus, the oscillation frequency may no longer be dependent on the read current of an SRAM cell, and instead it may depend on the components used to measure the read current and provide oscillations. During the bypass mode, the bypass gate 28B may open, thereby preventing any bit line current from driving the Schmitt trigger 23.

The output of the oscillate logic 20 is also provided to the divider 22, which may divide the oscillation frequency by a suitable value. In one particular implementation, divider 22 may divide the oscillation frequency by 128. Although in other embodiments other divider values may be used as desired.

The output of divider 22 is provided directly to I/O pin 32 so that the raw divided oscillation waveform may be observed external to the integrated circuit 10 if desired. However, the output of divider 22 is also provided to counter 24. The counter 24 may include a counter circuit (not shown) that may count the number of cycles of the oscillator circuit in a given period of time. The counter value may be output to I/O pin 32, so that the frequency of oscillation may be determined.

Referring to FIG. 2, more detailed aspects of portions of the integrated circuit 10 of FIG. 1 are shown. Components that correspond to those shown in FIG. 1 are numbered identically for clarity an simplicity. In the illustrated embodiment, the bit lines BL_H and BL_L are shown as an output from the SRAM array 12. The bit line BL_L is coupled to the bypass gate 28B and provided to an input to the Schmitt trigger 23. The output of the Schmitt trigger 23 is provided as an Osc. Out signal to, for example, the divider 22 of FIG. 1, and also to loop inversion logic 221. In one embodiment, loop inversion logic 221 may include combinatorial logic gates, buffers, and inverters (not shown) to enable and disable the precharge logic 18. In addition, the loop inversion logic 221 output may also be used to gate (i.e., enable and disable) the word line decode unit 16 so that during the time the bit-lines are precharging, the word lines to the SRAM array 12 are disabled. As described further below, the WR_En signal may be used to gate the loop inversion logic 221 (and thus precharge logic 18) to prevent oscillation while the SRAM cells are being written.

As described above, during normal operation, the loop formed by the BL_L, the Schmitt trigger 23, precharge logic 18, and each particular SRAM cell forms a ring oscillator circuit. The bypass gate 28B is normally closed to facilitate the BL_L signal being fed to the Schmitt trigger 23. However, to enter the bypass mode, the bypass signal may be asserted. As such, bypass gate 28B may open and bypass gate 28A may close, effectively bypassing the precharge logic 18, SRAM cells 213 and BL_L. Thus, in bypass mode the oscillation loop only includes the Schmitt trigger 23, the loop inversion logic 221 and bypass gate 28A. By using the bypass mode, the effects of the oscillation loop itself may be quantified for a given integrated circuit and if desired, cancelled out when testing multiple integrated circuits.

Figure 3:
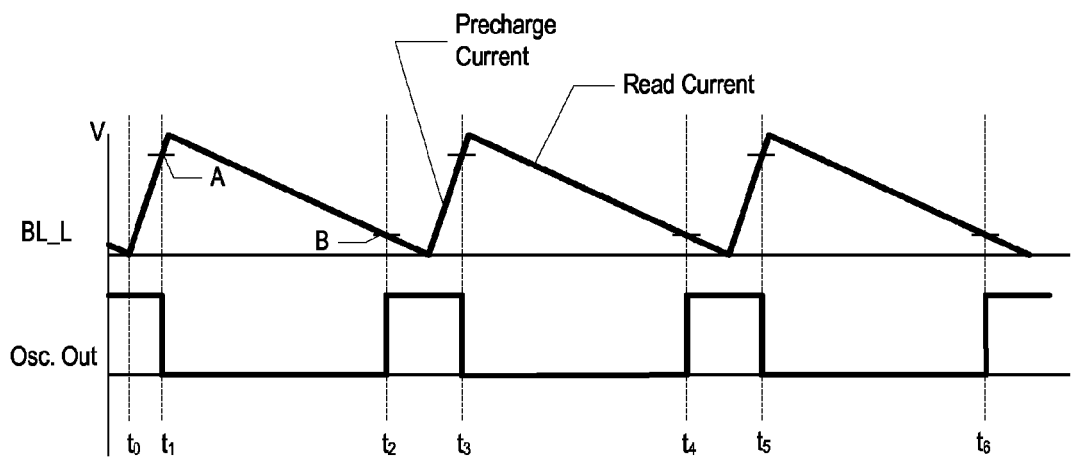
FIG. 3 is a timing diagram depicting the waveforms of one embodiment of the oscillator circuit shown in FIG. 1 and FIG. 2.

Referring to FIG. 3, a timing diagram depicting the waveforms of one embodiment of the oscillator circuit shown in FIG. 1 and FIG. 2 is shown. In the illustrated embodiment, the timing diagram includes the BL_L signal (which is the input to the Schmitt trigger 23) and the Osc. Out signal of the Schmitt trigger 23. The signals represent voltage vs. time.

As shown at time $t_0$, the voltage and thus the current on the BL_L, is at a minimum. The pre-charge logic 18 turns on and begins ramping the current to precharge the BL_L line. At time $t_1$ the voltage reaches the upper threshold of the Schmitt trigger 23 (shown as 'A'), the output of the Schmitt trigger 23 flips to a voltage at or near the ground reference. After some number of gate delays within loop inversion logic 221, the precharge logic 18 turns off the precharge current. The appropriate write line WL_x is enabled, and the read current begins to flow from the selected SRAM cell, thereby pulling down the BL_L signal. This read current bleed-off continues and at time $t_2$, the voltage on the BL_L line reaches the lower threshold of the Schmitt trigger 23, at which point the Schmitt trigger 23 flips and to output a voltage at or near the VDD rail. Again, as above, after some number of gate delays the precharge logic 18 is enabled and the current begins to ramp, thereby starting the next oscillation cycle. This oscillatory behavior continues as long as the circuit is powered up, and the WR_En is de-asserted.

Accordingly, as shown, the frequency of oscillation is largely determined by the read current portion of the triangular waveform. Thus, as described further below, by measuring the frequency of oscillation for each SRAM cell, the variability of the read currents from cell to cell may be determined. Taking that further, if the frequencies of the SRAM cells of many similar integrated circuits are measured, the variability of the read currents across one or more wafers and/or wafer lots may be determined.

It is noted that although the above embodiment uses the bit line BL_L, it is contemplated that in other embodiments, the bit line BL_H may instead be used. In such embodiments, a logic value of zero may be written to all the SRAM cells prior to the frequency measurement, whereas when using the BL_L bit line, a logic value of one may be written to all SRAM cells prior to measurement.

Figure 4:
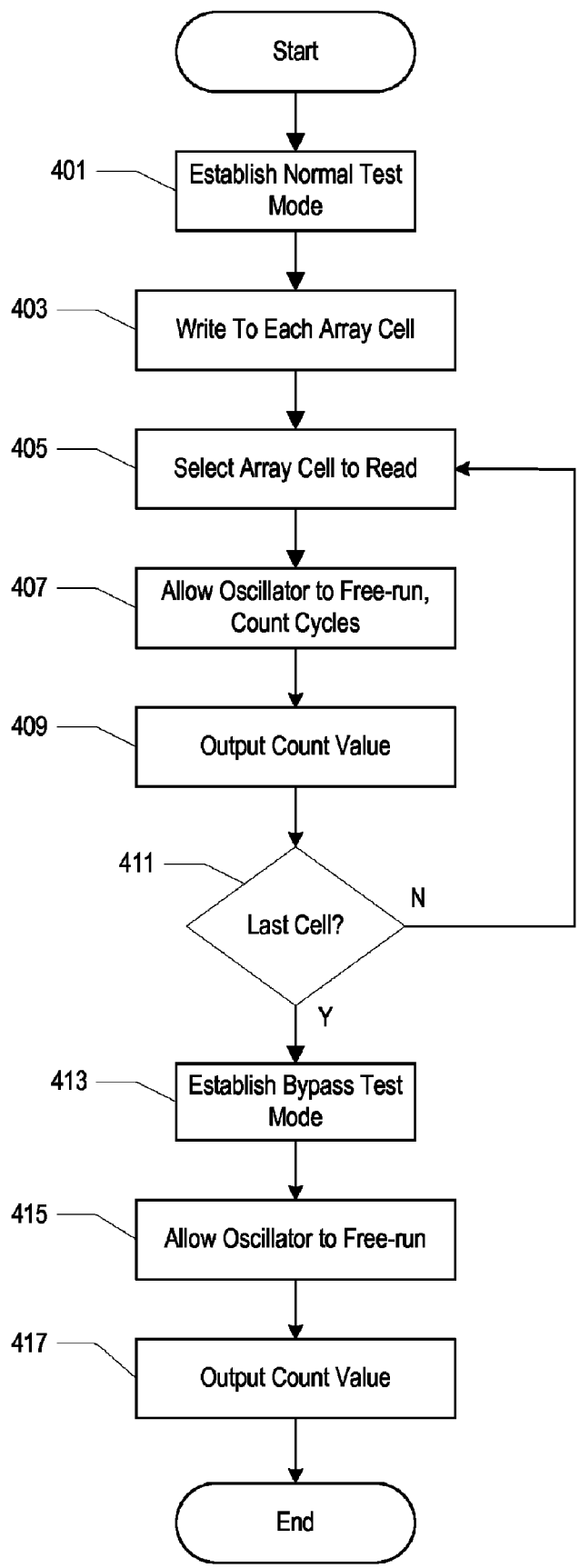
FIG. 4 is a flow diagram describing operational aspects of the embodiments of the SRAM read current variability measurement mechanism depicted in FIG. 1 through FIG. 3.

Turning to FIG. 4, a flow diagram describing operational aspects of the embodiments of the SRAM read current variability measurement mechanism depicted in FIG. 1 through FIG. 3 is shown. Referring collectively to FIG. 1 through FIG. 4 and beginning in step 401 of FIG. 4 a normal test mode is established for the integrated circuit 10. For example, power may be applied and the bypass signal may be de-asserted. In one embodiment, a logic value of one may be written to each of the SRAM cells in the SRAM array 12 (block 403). In other embodiments however, only a portion of the cells may be written. For example, the appropriate WR_En and WR_Sel signals may be asserted to the read/write control 14, which in turn may provide the encoded write signals to the WL decode unit 16. The WL decode unit 16 may generate the necessary word line signals to access each cell in the SRAM array 12. As each word line is activated, the read/write control may apply the correct values (e.g., one and zero, respectively) to the bit lines BL_H and BL_L to write a logic value of one into each cell.

Once all SRAM cells have been written, the first/next SRAM cell to be read is selected via the WR_Sel signals (block 405). The WR_En signal is deasserted, the RD_En signal is asserted and the ring oscillator is then allowed to free-run as described above, at a frequency that is based upon the read current and pre-charge current, while the counter 24 counts the number of cycles (block 407). In one embodiment, the oscillator is allowed to run for a predetermined amount of time. The WR_En signal may be asserted to stop the pre-charge logic 18 from pre-charging the bit lines. The output count value may be output to the I/O pin 32 (block 409). If the last cell has not been checked (block 411), operation proceeds as described above in block 405, in which the next SRAM cell is selected, the oscillator is allowed to run while the counter 24 counts the cycles, and the count is output.

Referring back to block 411, if all cells have been checked, the bypass signal may be asserted to establish the bypass mode (block 413). As described above, in the bypass mode, the SRAM read current is bypassed, and the oscillator loop includes only the Schmitt trigger 23, the loop inversion logic 221, and the bypass gate 28A. The oscillator is again allowed to free-run for a predetermined amount of time while the counter 24 counts the cycles (block 415). The output count value is provided to I/O pin 32 (block 417).

As mentioned above, in one embodiment, the above testing procedure may be implemented using a test system (not shown) suitably connected to integrated circuit 10. The test system may include some type of processing unit that may execute test software which may cause various events to occur. For example, in various embodiments, in response to execution of the test instructions, the test system may provide signals corresponding to the input control signals, one or more clock signals, one or more supply voltages, and the like. The test system may also be configured to read out the output counter values, and or the Osc. Out waveform.

However, it is likewise contemplated that in other embodiments, all or a portion of the testing functionality may be implemented using components embedded on integrated circuit 10, and thus a minimum of control signals may be provided by the test system. More particularly, in one embodiment, integrated circuit 10 may be implemented as a test chip on a wafer, in which case the integrated circuit 10 may not have other functionality. In other embodiments, the components shown in the above embodiments may be implemented within the scribe lines of a wafer.

In still other embodiments, integrated circuit 10 may include other functionality. For example, integrated circuit 10 may be a processor chip, a communication chip, a controller, or the like. In such embodiments, the components shown in the above embodiments may be implemented as just one part of the integrated circuit 10 chip. One such embodiment is shown in FIG. 5 and described below.

Figure 5:
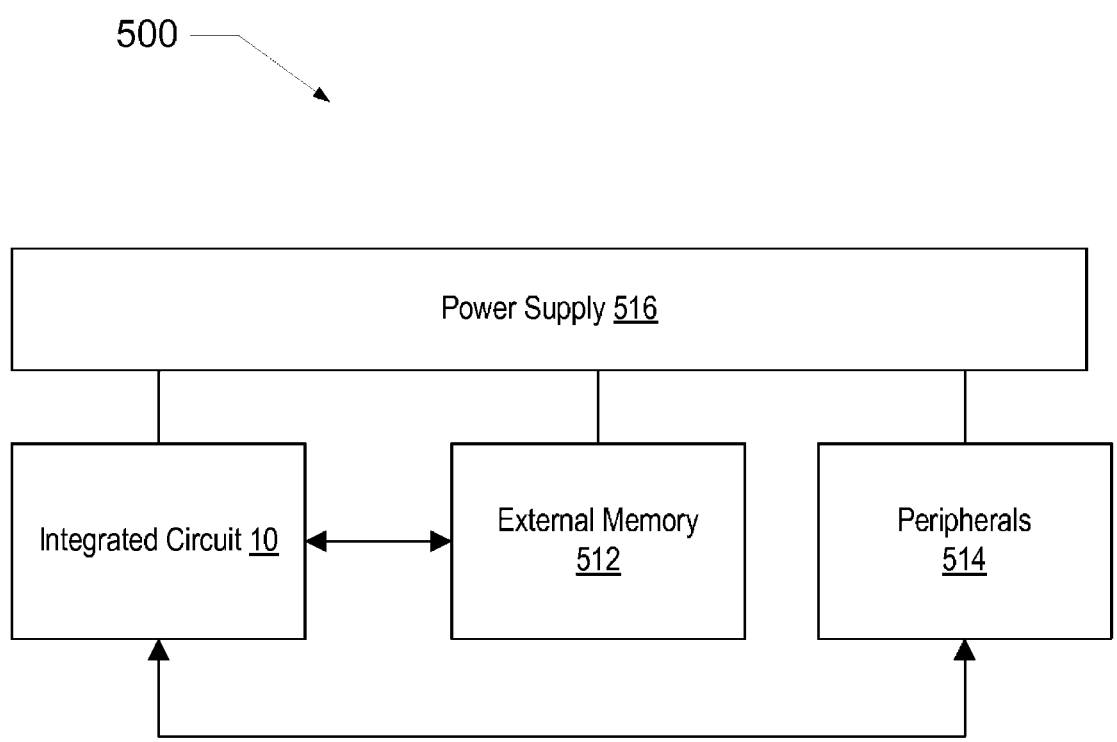
FIG. 5 is a block diagram of one embodiment of a system including the integrated circuit shown in FIG. 1

Turning to FIG. 5, a block diagram of one embodiment of a system 500 including the integrated circuit 10 is shown. The system 500 includes at least one instance of the integrated circuit 10 of FIG. 1 coupled to one or more peripherals 514 and an external memory 512. The system 500 also includes a power supply 516 that may provide one or more supply voltages to the integrated circuit 10 as well as one or more supply voltages to the memory 512 and/or the peripherals 514. In some embodiments, more than one instance of the integrated circuit 10 may be included.

The external memory 512 may be any desired memory. For example, the memory may include dynamic random access memory (DRAM), static RAM (SRAM), flash memory, or combinations thereof. The DRAM may include synchronous DRAM (SDRAM), double data rate (DDR) SDRAM, DDR2 SDRAM, DDR3 SDRAM, etc.

The peripherals 514 may include any desired circuitry, depending on the type of system 110. For example, in one embodiment, the system 500 may be a mobile device and the peripherals 514 may include devices for various types of wireless communication, such as WiFi, Bluetooth, cellular, global position system, etc. The peripherals 514 may also include additional storage, including RAM storage, solid-state storage, or disk storage. The peripherals 514 may include user interface devices such as a display screen, including touch display screens or multi-touch display screens, keyboard or other keys, microphones, speakers, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An integrated circuit comprising:
   a static random access memory (SRAM) cell;
   an oscillator circuit coupled to receive a signal indicative of a read current of the SRAM cell, and configured to oscillate at a frequency that is dependent upon the read current of the SRAM cell;
   wherein the oscillator circuit is further configured to oscillate at a frequency that is dependent upon a current established within the oscillator circuit that is irrespective of the read current during operation in a bypass mode of operation; and
   a frequency determining circuit configured to output a value corresponding to the frequency of oscillation of the oscillator circuit.

2. The integrated circuit as recited in claim 1, wherein the frequency of oscillation of the oscillator circuit is further dependent upon a current established in a bit line of the SRAM cell during a precharge operation.

3. The integrated circuit as recited in claim 1, further comprising a precharge circuit coupled to the oscillator circuit and configured to precharge the SRAM cell.

4. The integrated circuit as recited in claim 1, wherein the frequency determining circuit comprises a counter circuit configured to count a number of cycles of oscillation of the output of the oscillator circuit.

5. An integrated circuit comprising:
a static random access memory (SRAM) array including a plurality of SRAM cells;
a selection circuit coupled to the SRAM array and configured to select a particular SRAM cell of the plurality of SRAM cells in response to a selection input;
an oscillator circuit coupled to receive a signal indicative of a read current of a selected SRAM cell of the SRAM array, and configured to oscillate at a frequency that is dependent upon the read current of the selected SRAM cell during operation in a first mode;
wherein the oscillator circuit is further configured to oscillate at a frequency that is dependent upon a current established within the oscillator circuit and irrespective of the read current of the selected SRAM cell during operation in a second mode in response to assertion of a bypass control signal; and
a frequency determining circuit coupled to the oscillator circuit and configured to output a value corresponding to the frequency of oscillation of the oscillator circuit.

6. The integrated circuit as recited in claim 5, wherein the oscillator frequency is further dependent upon a current established in a bit line of the selected SRAM cell during a pre-charge operation.

7. The integrated circuit as recited in claim 5, wherein the oscillator circuit comprises a Schmitt trigger coupled to a bit line of the selected SRAM cell and configured to generate an output waveform corresponding to the read current of the bit line.

8. The integrated circuit as recited in claim 7, further comprising a precharge circuit coupled to receive a signal corresponding to an output of the Schmitt trigger and configured to alternately precharge the bit line of the selected SRAM cell during a portion of each cycle of the output waveform.

9. The integrated circuit as recited in claim 8, wherein during a remaining portion of each cycle of the output waveform, a particular word line is enabled to the selected SRAM cell to enable the read current to flow to the bit line of the SRAM cell.

10. A method comprising:
executing a read current test of a static random access memory (SRAM) array within an integrated circuit, wherein executing the read current test comprises:
writing a value to at least a portion of a plurality of SRAM cells in the SRAM array;
a selection circuit selecting a particular SRAM cell;
an oscillator circuit receiving a signal indicative of a read current of a selected SRAM cell of the plurality of SRAM cells, and oscillating at a frequency that is dependent upon the read current of the selected SRAM cell during operation in a first mode;
the oscillator circuit oscillating at a frequency that is dependent upon a current established within the oscillator circuit and irrespective of the read current of the selected SRAM cell during operation in a second mode in response to assertion of a bypass control signal; and
a frequency determining circuit outputting a value corresponding to the frequency of oscillation of the oscillator circuit.

11. The method as recited in claim 10, further comprising the oscillator circuit alternately enabling precharging and enabling the read current to flow from the selected SRAM cell.

12. The method as recited in claim 10, further comprising the oscillator circuit generating an output waveform that corresponds to the read current of a bit line of the selected SRAM cell.

13. The method as recited in claim 10, further comprising a precharge circuit precharging the SRAM cell during a portion of each cycle of the output waveform in response to receiving a signal corresponding to an output of the oscillator circuit.

14. The method as recited in claim 13, further comprising a word line circuit enabling the read current to flow to the bit line of the selected SRAM cell by enabling a particular word line to the selected SRAM cell during a remaining portion of each cycle of the output waveform.

15. The method as recited in claim 10, further comprising the frequency determining circuit counting a number of cycles of an output waveform of the oscillator circuit.

16. The method as recited in claim 10, wherein the value written to the at least a portion of the SRAM cells corresponds to a logic value of one, and the bit line comprises the bit line 'L' of a pair of bit lines.

17. The method as recited in claim 10, wherein the value written to the at least a portion of the SRAM cells corresponds to a logic value of zero, and the bit line comprises the bit line 'H' of a pair of bit lines.

* * * * *